United States Patent [19]
Sugibayashi

[11] Patent Number: 6,104,628
[45] Date of Patent: Aug. 15, 2000

[54] INTEGRATED-CIRCUIT DEVICE WITH MICROPROCESSOR OF PRESCRIBED SHAPE

[75] Inventor: Tadahiko Sugibayashi, Tokyo, Japan

[73] Assignee: NEC Corporation, Tokyo, Japan

[21] Appl. No.: 09/377,162

[22] Filed: Aug. 19, 1999

[30] Foreign Application Priority Data

Aug. 25, 1998 [JP] Japan .................................. 10-238868

[51] Int. Cl.[7] ....................................................... G11C 5/02
[52] U.S. Cl. ................................................. 365/51; 365/49
[58] Field of Search ................................. 365/51, 49, 52; 711/113, 114, 122, 118

[56] References Cited

U.S. PATENT DOCUMENTS

5,544,293  8/1996  Nozawa ...................................... 365/49
5,966,316  10/1999 Tsukikawa .................................. 365/51
5,999,437  12/1999 Chengson et al. ......................... 365/52

*Primary Examiner*—Tan T. Nguyen
*Attorney, Agent, or Firm*—Sughrue, Mion, Zinn, Macpeak & Seas, PLLC

[57] ABSTRACT

An integrated-circuit device comprises a combination of a microprocessor in the form of a circuit cell having a prescribed shape as an existing microprocessor and cache memories and a tag memory each in the form of a circuit cell. The tag memory have the same row addresses as the cache memories, and some of the row addresses are converted to column addresses. The tag memory is of a structure in which a basic structure similar to a conventional structure is divided into a plurality of parts in one of x and y directions, and the parts are arrayed in the other of the x and y directions. The tag memory thus shaped can be placed in a dead space on a circuit board, and hence an undesirable dead space can be eliminated from the integrated-circuit device.

6 Claims, 13 Drawing Sheets

INTEGRATED-CIRCUIT DEVICE WITH MICROPROCESSOR OF PRESCRIBED SHAPE

BACKGROUND OF THE INVENTION

1. Field of the Invention

The present invention relates to an integrated-circuit device having a microprocessor which comprises rectangular circuit cells, and more particularly to an integrated-circuit device having a microprocessor of a prescribed shape.

2. Description of the Related Art

Various integrated-circuit devices are presently used in various electronic devices. One example of integrated-circuit devices for performing a complex data processing task is referred to as a microprocessor. For data processing purpose, a microprocessor reads various data from a main memory external thereto. However, it is inefficient for the microprocessor to repeatedly read the same data from the main memory.

In view of the above shortcoming, it has been customary to connect a cache memory for temporarily storing data in the microprocessor to increase the data processing rate of the microprocessor. There is available a circuit module comprising a microprocessor and cache memories that are housed together in one package.

One conventional circuit module of the above design will be described below with reference to FIGS. 1 and 2 of the accompanying drawings.

Figure 1:
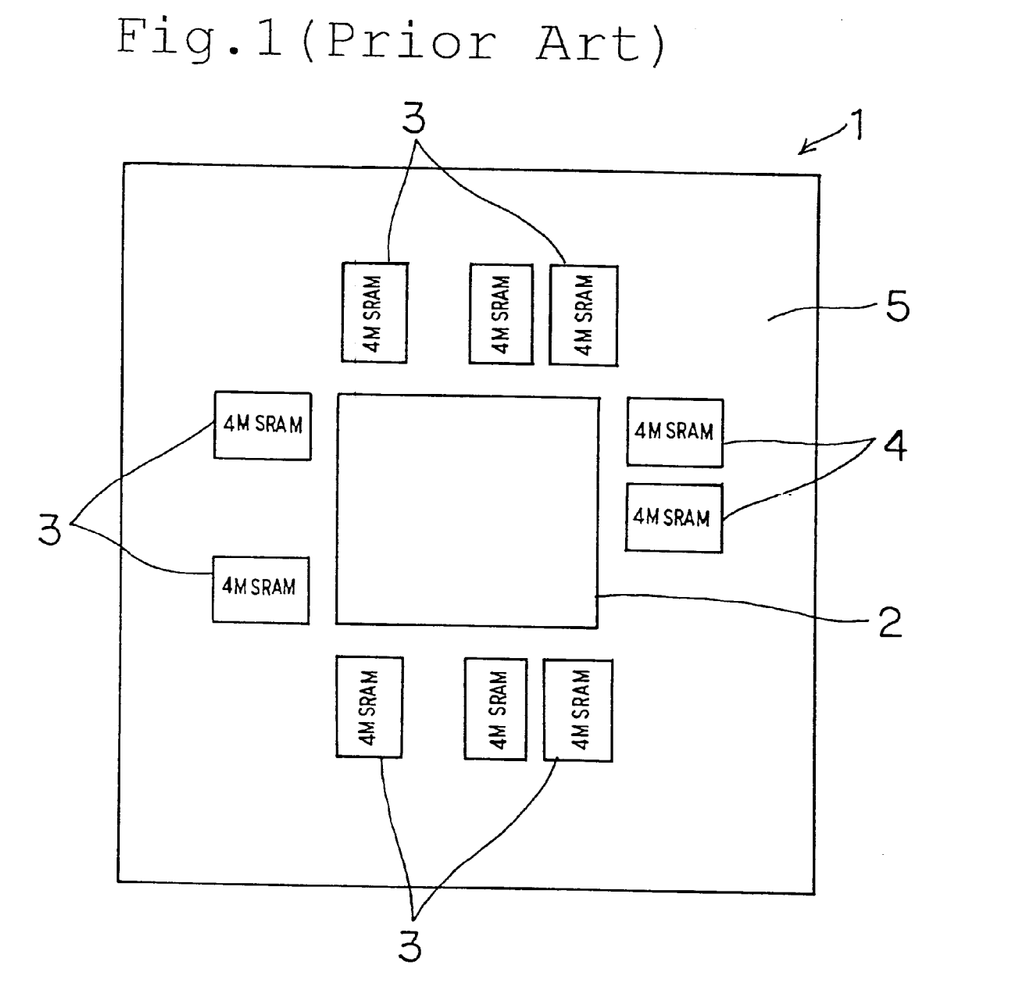
FIG. 1 is a schematic plan view of an internal structure of a conventional circuit module.

As shown in FIG. 1, the circuit module, generally denoted by 1, comprises a single microprocessor 2 as an integrated-circuit device, eight cache memories 3 as integrated-circuit devices, and two tag memories 4 as integrated-circuit devices. The microprocessor 2, the cache memories 3, and the tag memories 4 are mounted on a main board 5.

Figure 2:
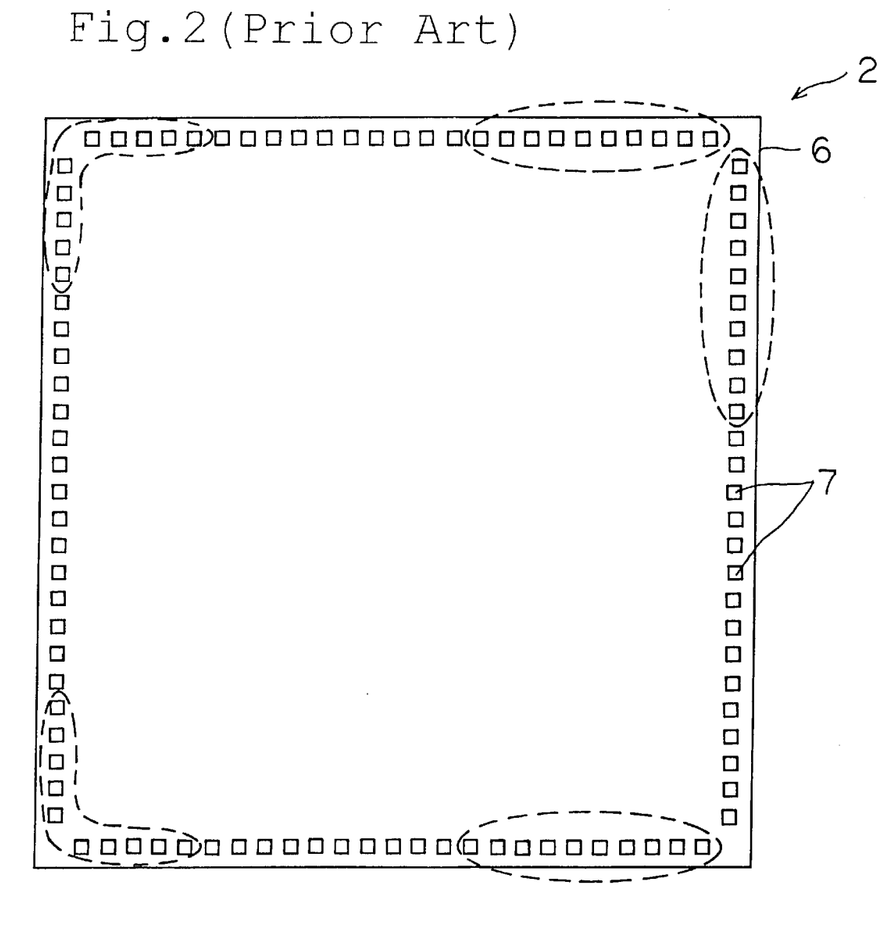
FIG. 2 is a schematic plan view showing the layout of connection terminals of a microprocessor as an integrated-circuit device in the conventional circuit module shown in FIG. 1.

As shown in FIG. 2, the microprocessor 2 has a substantially square circuit board 6 supporting a number of connection terminals 7 arranged on outer peripheral edges thereof. An integrated semiconductor circuit (not shown) is mounted centrally on the circuit board 6, and connected to the connection terminals 7.

The microprocessor 2 is mounted substantially centrally on the main board 5. The cache memories 3 and the tag memories 4 are disposed on the main board 5 around the microprocessor 2. The cache memories 3 and the tag memories 4 are connected to some (enclosed by dotted lines in FIG. 2) of the connection terminals 7, and positioned such that interconnections between these memories 3, 4 and the connection terminals 7 are the shortest.

Each of the cache memories 3 and the tag memories 4 comprises an SRAM (Static Random-Access Memory) having a storage capacity of 4 Mbits, and comprises an integrated circuit mounted on a rectangular circuit board. The main board 5 supports a number of connection terminals (not shown) arranged on outer peripheral edges thereof. The microprocessor 2 and the cache memories 3 are connected to these connection terminals on the main board 5.

The microprocessor 2 includes a cache memory and a tag memory (not shown) used as a primary cache. Therefore, the cache memories 3 and the tag memories 4 are used as a secondary cache. In order to decide whether cache data temporarily stored in the cache memories 3 have been hit, the tag memories 4 temporarily store tag data corresponding to the address data of the cache data.

The circuit module 1 of the above structure is used as part of an electronic device (not shown) for processing various data. The microprocessor 2 reads various data from an external main memory (not shown) connected to the circuit module 1, and processes the read data.

Since it is not efficient for the microprocessor 2 to repeatedly read the same data from the main memory, it is customary for the microprocessor 2 to temporarily store various data read from the main memory in the cache memories 3 and temporarily store tag data corresponding to the address data of the stored data in the tag memories 4.

For reading some data from the cache memories 3, the microprocessor 2 compares the tag data in the tag memories 4 with the address data of the data in the cache memories 3. If the tag data agrees with the address data, then since a cache hit is made, the microprocessor 2 reads the stored data from the cache memories 3.

In the circuit module 1, therefore, the number of times that the microprocessor 2 reads the same data from the external main memory can be reduced, and the microprocessor 2 can process various data with high efficiency.

Various processes are available for fabricating integrated-circuit devices such as the microprocessor 2. At present, it is the general practice to design beforehand various circuit cells called standard cells, and combine these circuit cells as desired into an integrated-circuit device.

As described above, the circuit module 1 comprises the microprocessor 2, the cache memories 3, and the tag memories 4, each in the form of an integrated-circuit device, all mounted on the main board 5. Consequently, the circuit module 1 is large in size and cannot be manufactured with high productivity. One approach to reduce the size of the circuit module 1 and increase the productivity of the circuit module 1 is to construct the microprocessor 2, the cache memories 3, and the tag memories 3 as a single integrated-circuit device.

In view of the above approach, the inventor has conceived a process of constructing cache memories and tag memories as small-size DRAMs (Dynamic Random-Access Memories) for use as circuit cells corresponding to standard cells, and combining those circuit cells with a circuit cell as a microprocessor, thereby making up a single integrated-circuit device.

If the microprocessor 2 from which the connection terminals 7 shown in FIG. 2 are omitted is used as a circuit cell, then it is possible to design an integrated-circuit device as efficiently as when designing an integrated-circuit device with only standard cells.

Figure 3:
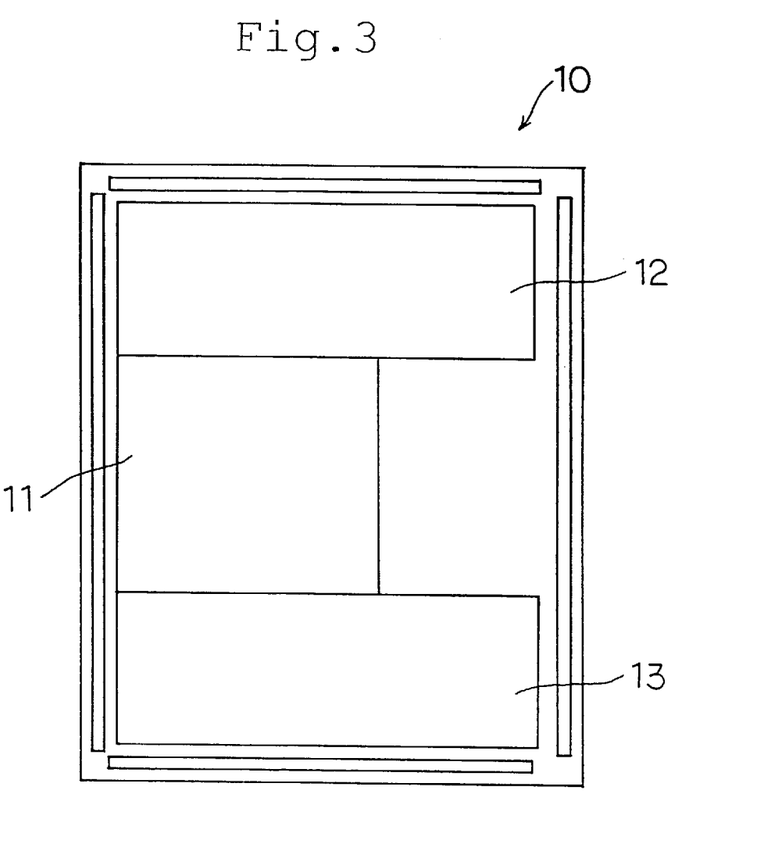
FIG. 3 is a schematic plan view of an internal structure of an integrated-circuit device which was devised by the inventor and not known in the art.

In the above microprocessor 2, since the connection terminals 7 connected to the cache memories 3 are basically positioned on and near the upper and lower edges of the circuit board 6, the inventor developed the concept of the integrated-circuit device 10 shown in FIG. 3 of the accompanying drawings. In the integrated-circuit device 10, two cache memories 12, 13 each comprising a circuit cell are individually positioned above and below a microprocessor 11 comprising a circuit cell.

However, if each of the cache memories 12, 13 comprises a rectangular circuit cell, then since the length of one side thereof corresponds to row addresses and the length of another side thereof corresponds to column addresses, the cache memories 12, 13 are of an elongate rectangular shape that is vertically shorter and horizontally longer than the substantially square microprocessor 11.

Consequently, if the cache memories 12, 13 were simply located on opposite sides of the microprocessor 11, a dead space would be created laterally of the microprocessor 11. In an attempt to avoid this drawback, the inventor tried to position a tag memory 14 comprising a circuit cell in such a dead space formed laterally of the microprocessor 11.

Figure 4:
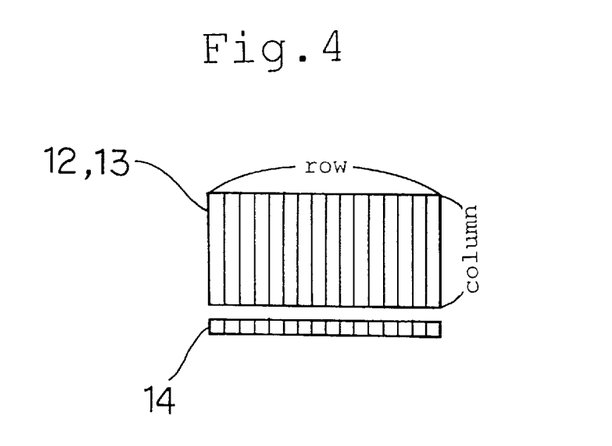
FIG. 4 is a schematic view showing the relationship between the shapes of cache memories and a tag memory.

If the tag memory 14 comprises a rectangular circuit cell, however, the length of one side of the tag memory 14 corresponds to the same row addresses as the cache memories 12, 13 and the length of another side of the tag memory 14 corresponds to one column address. Therefore, as shown in FIG. 4 of the accompanying drawings, the tag memory 14 is of an elongate rectangular shape having the same horizontal length as the cache memories 12, 13 and a much smaller vertical length. As a result, the tag memory 14 cannot be positioned in the dead space defined laterally of the microprocessor 11.

SUMMARY OF THE INVENTION

It is therefore an object of the present invention to provide an integrated-circuit device which comprises a combination of a microprocessor having the structure of an existing microprocessor and cache and tag memories without an undesirable dead space.

An integrated-circuit device according to the present invention has a microprocessor, two cache memories, and a tag memory, each comprising a circuit cell. The microcomputer can temporarily store data that are to be repeatedly processed into the cache memories and also temporarily store tag data into the tag memory. The microprocessor is capable of reading the cache data temporarily stored in the cache memories based on the tag data temporarily stored in the tag memory. Consequently, the microprocessor repeatedly reads the same data less frequently from an external memory, and hence can process the data highly efficiently.

The cache memory constructed as a rectangular circuit cell has a length in x directions corresponding to column addresses and a length in y directions corresponding to row addresses. If the tag memory were simply constructed as a rectangular circuit cell, then, the tag memory would have an extremely elongate rectangular shape whose length in the x directions would be the same as the cache memories and whose length in the y directions would correspond to one column address.

In the integrated-circuit device according to the present invention, however, the tag memory has some of its row or column addresses converted to column or row addresses, and hence has its lengths in the x and y directions adjusted to desired sizes.

For example, if some of the row addresses are converted to column addresses, the length, corresponding to the row addresses, of the tag memory in the y directions is reduced and the length, corresponding to the column addresses, of the tag memory in the x directions is increased. The tag memory is then divided into a plurality of parts in the x directions, and the parts are arrayed in the y directions, so that the tag memory is of an elongate shape which is short in the x directions and long in the y directions. The length in the y directions of the tag memory is equalized to the microprocessor, and the tag memory and the microprocessor are juxtaposed in the x directions. The two cache memories are disposed one on each side of the microprocessor and the tag memory in the y directions. The resultant integrated-circuit device is of a rectangular shape with substantially no dead space created therein.

The integrated-circuit device according to the present invention may therefore be relatively small in size as its overall shape is rectangular with substantially no dead space created therein.

The tag memory of the integrated-circuit device is of a structure in which a basic structure corresponding to the same row addresses as the first cache memory and the second cache memory and one column address is divided into a plurality of parts in one of the x and y directions, and the parts are arrayed in the other of the x and y directions.

Since the tag memory can be shaped to fit well in a space defined laterally of the microprocessor in the x directions, the integrated-circuit device may be of a small size.

Each of the first cache memory, the second cache memory, and the tag memory may comprise a DRAM. Since DRAMs take up a smaller area than SRAMs, the integrated-circuit device with the two cache memories and the single tag memory being disposed around the single microprocessor may be of a small rectangular shape.

The above and other objects, features, and advantages of the present invention will become apparent from the following description with reference to the accompanying drawings which illustrate examples of the present invention.

DETAILED DESCRIPTION OF THE PREFERRED EMBODIMENTS

An integrated-circuit device according to the present invention will be described below with reference to FIGS. 5a–5c through 14. Horizontal and vertical directions and other terms representative of directions referred to herein are used with respect to structural details as viewed in FIGS. 5a–5c for an easier understanding of the present invention, and should not be interpreted as implying and being limited to any directions in the fabrication and use of the integrated-circuit device.

As shown in FIGS. 5a–5c and 6, the integrated-circuit device, generally denoted by 100, according to the present invention has a single circuit board 101 supporting thereon a microprocessor 102 as a circuit cell.

Figures 5A, 5B, 5C:
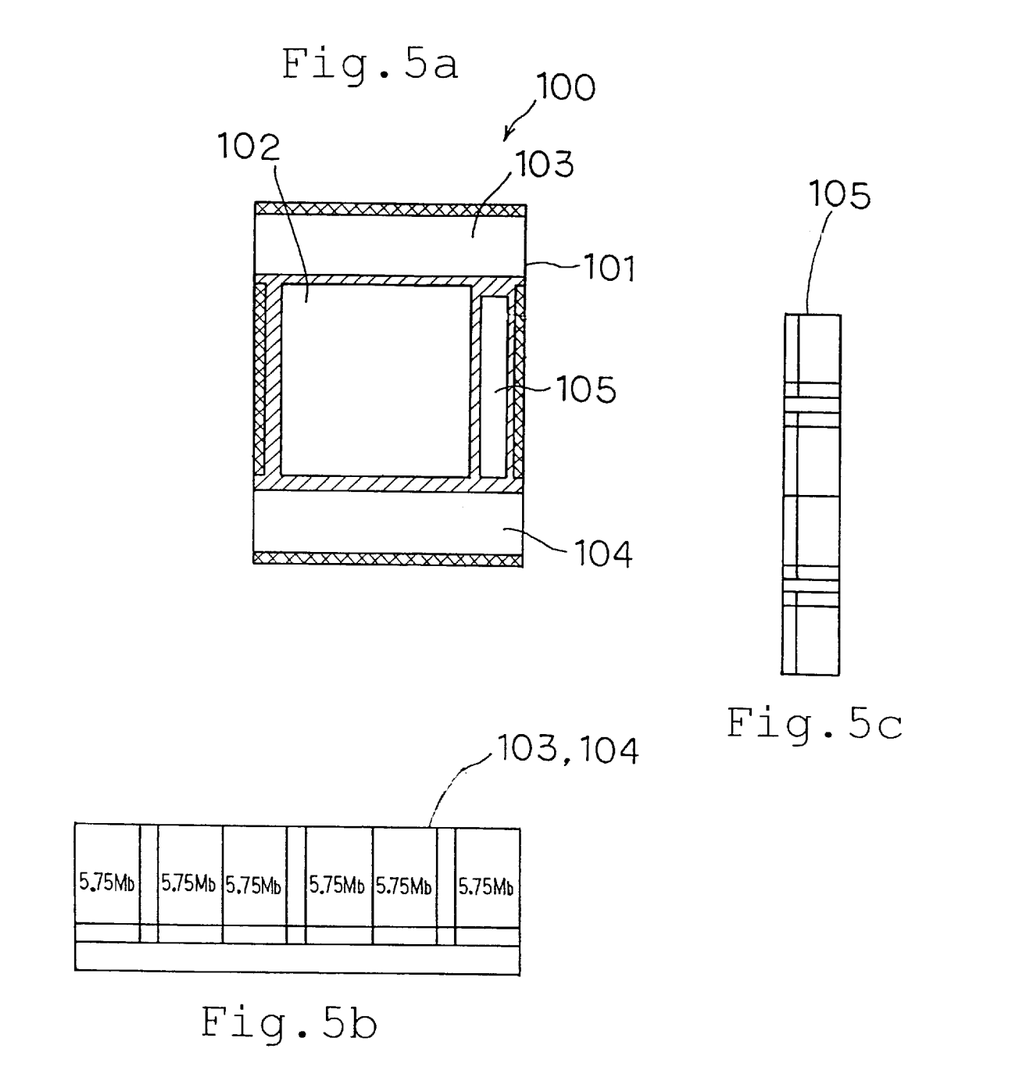
FIG. 5*a* is a schematic plan view of an internal structure of an integrated-circuit device according to the present invention.
FIG. 5*b* is a schematic plan view of an internal structure of cache memories in the integrated-circuit device shown in FIG. 5*a*.
FIG. 5*c* is a schematic plan view of an internal structure of a tag memory in the integrated-circuit device shown in FIG. 5*a*.

The integrated-circuit device 100 also has a first cache memory 103 and a second cache memory 104, each comprising a DRAM circuit cell as a standard cell, which are disposed on upper and lower end portions, respectively, of the circuit board 101.

The microprocessor 102 is positioned in an area defined between the first and second cache memories 103, 104 and displaced toward a left end of the circuit board 101. The integrated-circuit device 100 further includes a tag memory 105 as a circuit cell positioned in the area between the first and second cache memories 103, 104 and located in a right end portion of the circuit board 101.

Each of the circuit cells 102, 103, 104, 105 is of a rectangular shape. The lengths of these circuit cells 102, 103, 104, 105 in horizontal directions or x directions and vertical directions or y directions are expressed by combinations of four numerical values: a=14 (mm), b=1.5 (mm), c=13 (mm), and d=6 (mm).

The microprocessor 102 comprises a circuit cell which is of substantially the same structure as existing microprocessors. Therefore, the microprocessor 102 has a prescribed shape. For example, the length of the microprocessor 102 in the horizontal directions or x directions is approximately equal to the length a, i.e., 14.11 (mm), and the length of the microprocessor 102 in the vertical directions or y directions is approximately equal to the length b, i.e., 13.05 (mm).

Figure 7A:
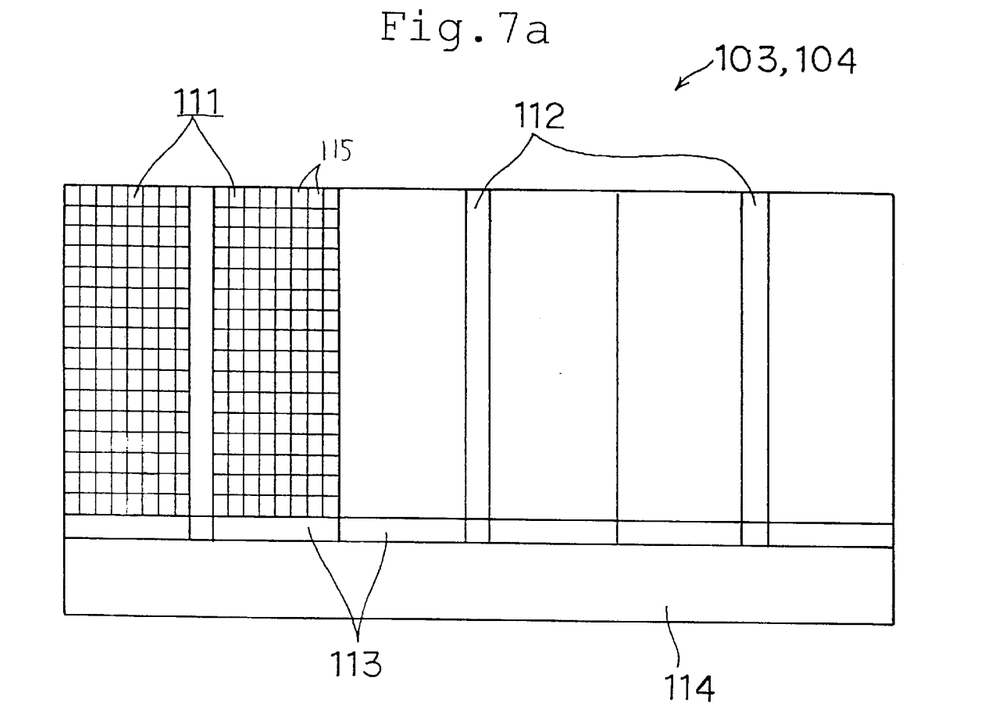
FIG. 7*a* is a schematic plan view of an internal structure of the cache memories.

As shown in FIG. 5b and FIG. 7a, each of the first and second cache memories 103, 104 is of a shape corresponding to row addresses and column addresses. The length of each of the first and second cache memories 103, 104 in the horizontal directions is 15.80 (mm) which is approximately equal to the length (a+b) corresponding to the column addresses, and the length of each of the first and second cache memories 103, 104 in the vertical directions is 5.50 (mm) which is approximately equal to the length d corresponding to the row addresses.

Figure 7B:
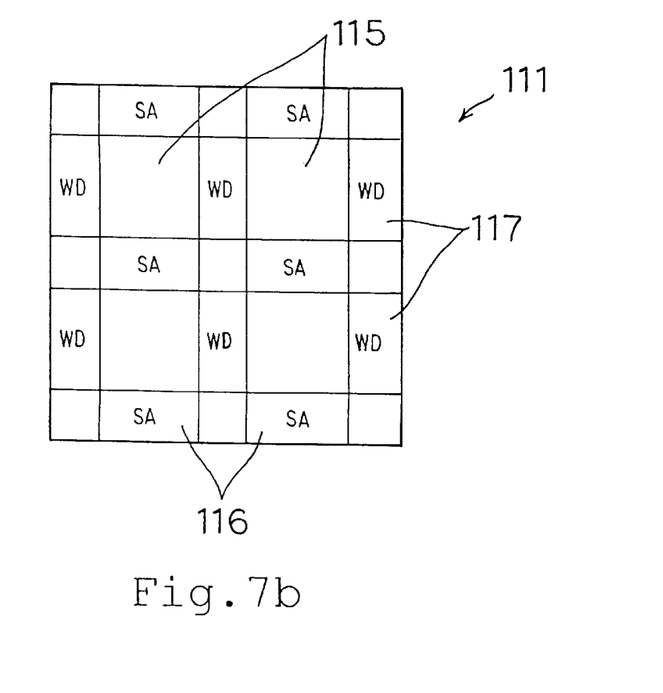
FIG. 7*b* is an enlarged plan view of a portion of the cache memories shown in FIG. 7*a*.

Specifically, as shown in FIG. 5b and FIGS. 7a, 7b, each of the first and second cache memories 103, 104 comprises six memory cell arrays 111 each having a storage capacity of 5.75 Mb., three X decoders 112, six Y decoders 113, and a peripheral circuit 114 such as an address buffer. Each of the memory cell arrays 111 comprises a number of memory cells 115, a sense amplifier 116, and a word driver 117.

Because the first and second cache memories 103, 104 of the above structure are positioned above and below the microprocessor 102, the circuit board 101 is of a vertically elongate rectangular shape whose length in the horizontal directions or x directions is 16.48 (mm) that is approximately equal to the length (a+b) and whose length in the vertical directions or y directions is 24.90 (mm) that is approximately equal to the length (c+2d).

Figure 8A:
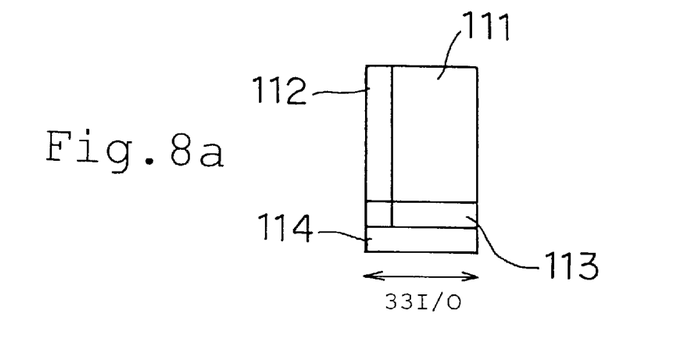
FIGS. 8*a* through 8*c* are schematic plan views showing the manner in which the tag memory is changed in shape.

Consequently, an area having a size of "b×c" is necessarily created laterally of the microprocessor 102. The tag memory 105 disposed as a rectangular circuit cell in such an area as a length of 1.40 (mm) in the horizontal direction which is approximately equal to the length b corresponding to the row addresses and a length of 12.80 (mm) in the vertical direction which is approximately equal to the length c corresponding to the column addresses, as shown in FIGS. 5c and 8c.

As with the first and second cache memories 103, 104, the tag memory 105 also comprises memory cell arrays 111, X decoders 112, Y decoders 113, and a peripheral circuit 114 such as an address buffer. As shown in FIG. 8a, an original tag memory 105 is of a very long rectangular shape corresponding to the same row addresses as the cache memories 103, 104 and one column address.

Figure 9:
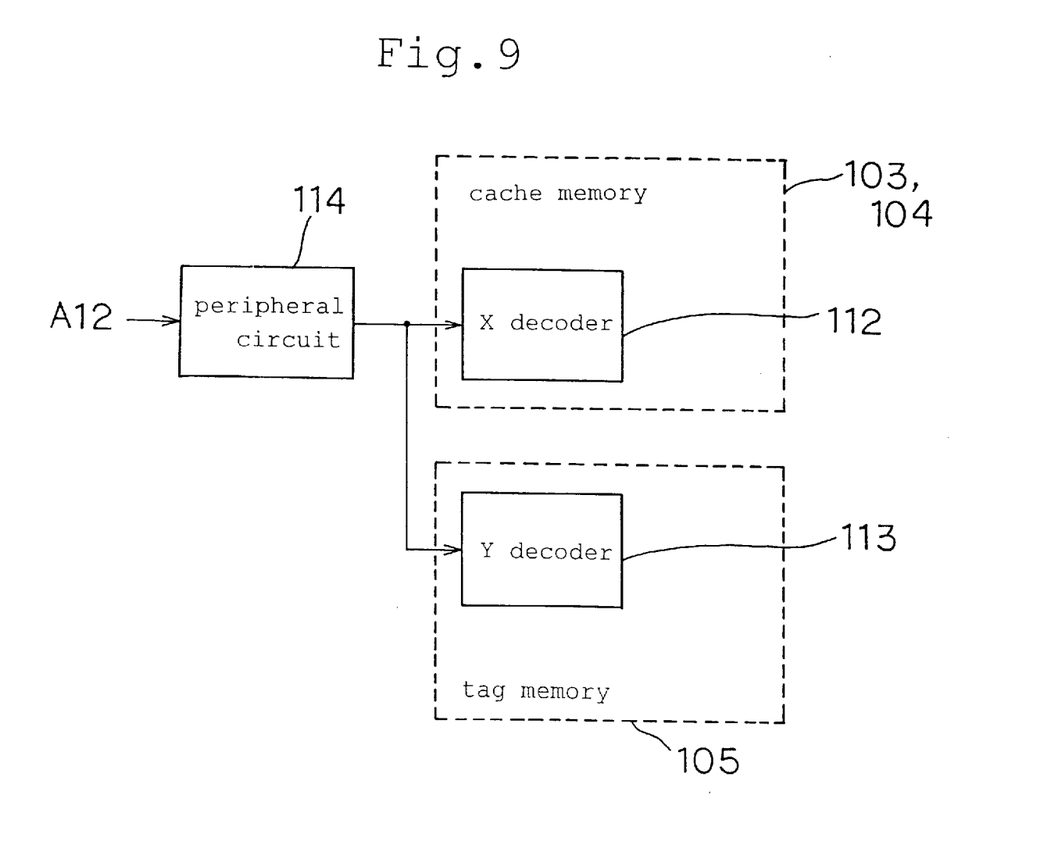
FIG. 9 is an equivalent block diagram showing the relationship between the cache memories and the tag memory.

Since the tag memory 105 is of a very long rectangular shape, internal interconnections (not shown) are formed to convert some of the row addresses to column addresses, as shown in FIG. 9.

Figure 8B:
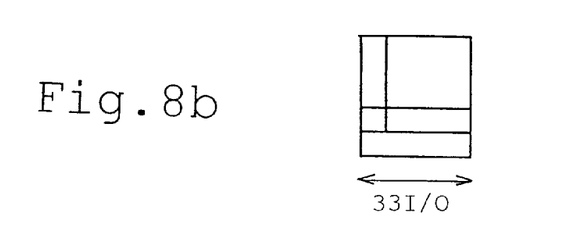
Figure 8C:
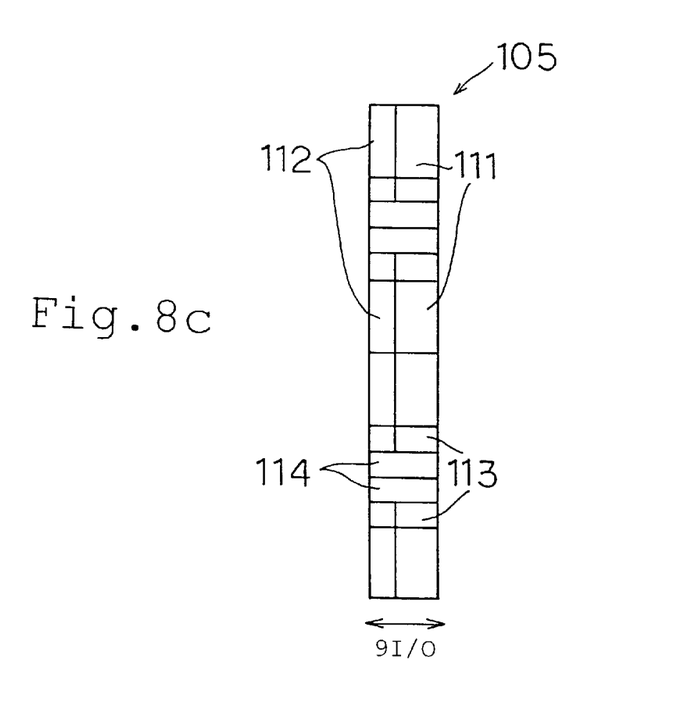

By thus converting some of the row addresses to column addresses, the length, corresponding to the row addresses, of the tag memory 105 in the vertical directions is reduced and the length, corresponding to the column addresses, of the tag memory 105 in the horizontal directions is increased, as shown in FIG. 8b. By dividing the tag memory 105 into four parts in the horizontal directions arraying the four parts in the vertical directions, the tag memory 105 is of a rectangular shape which is shorter in the horizontal directions and longer in the vertical directions, as shown in FIG. 8c.

Figure 6:
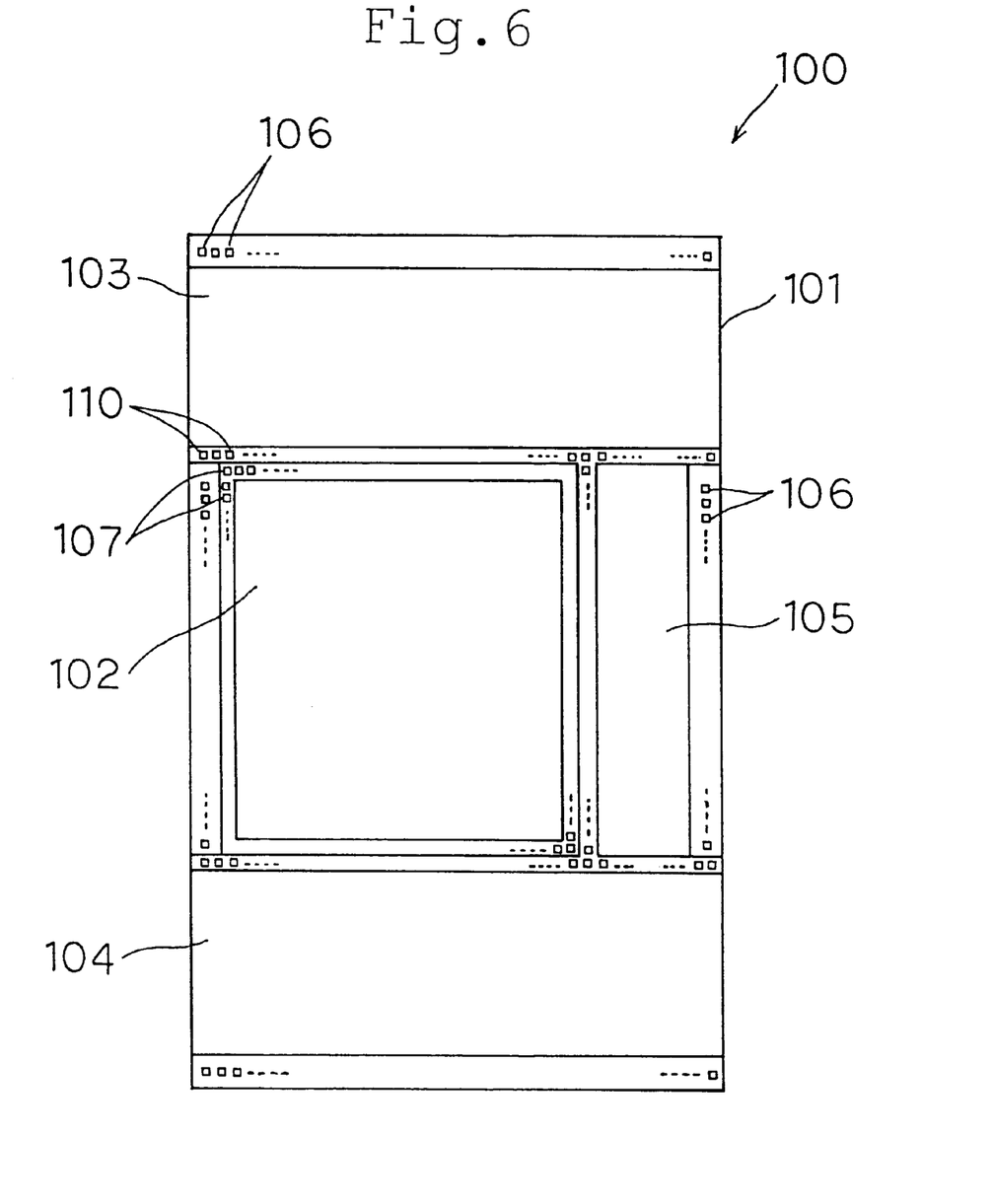
FIG. 6 is a schematic plan view of an internal structure of the integrated-circuit device.

As shown in FIG. 6, the integrated-circuit device 100 has a number of external connection terminals 106 disposed on upper and lower edges, i.e., outer peripheral edges, of the circuit board 101 and left and right edges of the area between the first and second cache memories 103, 104. The external connection terminals 106 are connected to the microprocessor 102 and the first and second cache memories 103, 104.

Figure 10:
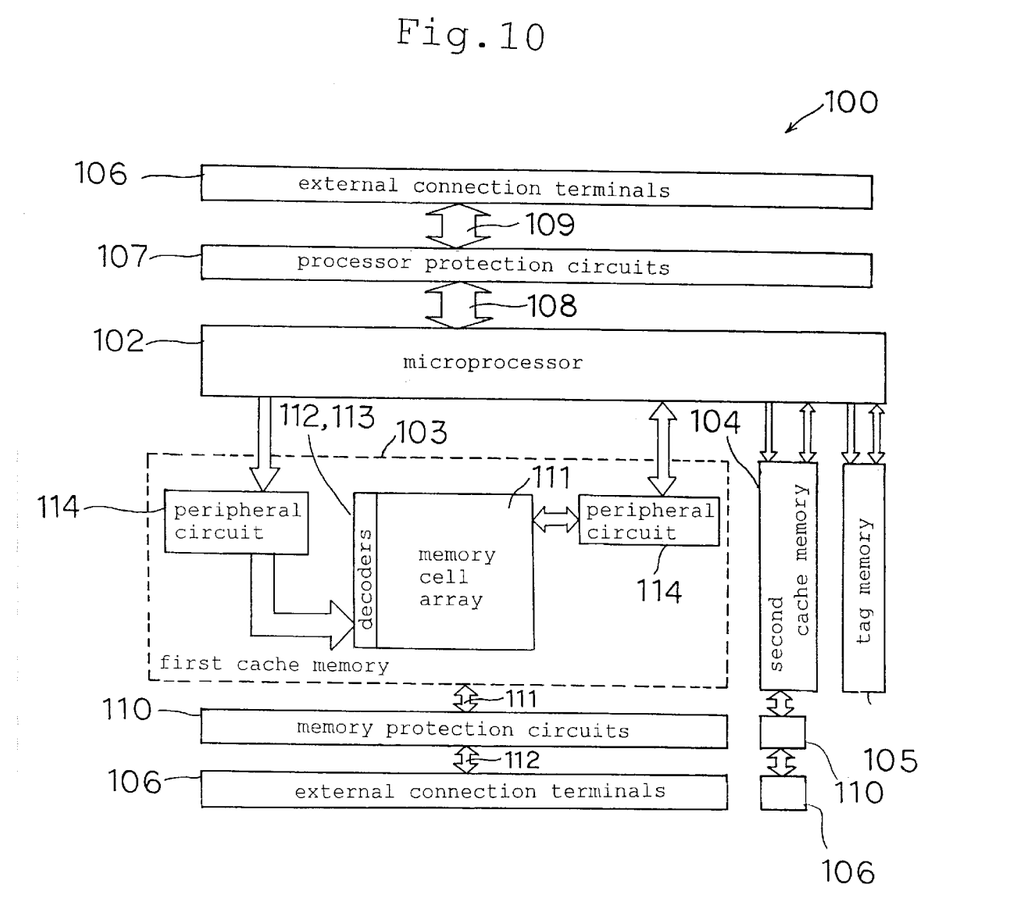
FIG. 10 is a block diagram of a circuit arrangement of the integrated-circuit device.

A plurality of processor protection circuits 107 are disposed on outer peripheral edges of the microprocessor 102. As shown in FIG. 10, the processor protection circuits 107 are connected to a plurality of connection terminals (not shown) of the microprocessor 102 by interconnections 108, and also to some of the external connection terminals 106 by a plurality of processor interconnections 109 that pass over the surfaces of the memories 103–105.

A plurality of memory protection circuits 110 connected to the memories 103–105 are disposed in areas between the first cache memory 103, the second cache memory 104, the tag memory 105, and the processor protection circuits 107. The memory protection circuits 110 are connected to a plurality of connection terminals (not shown) of the memories 103–105 by interconnections 111, and also to some of the external connection terminals 106 by a plurality of memory interconnections 112 that pass over the surfaces of the memories 103–105.

Figure 11A:
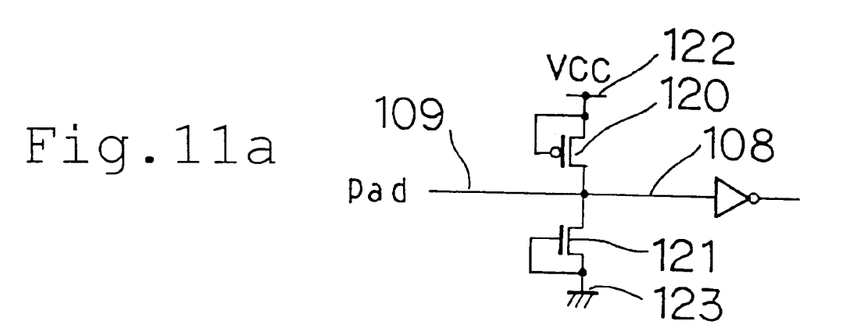
FIG. 11*a* is a circuit diagram of an equivalent circuit of a processor protection circuit.

Each of the processor protection circuits 107 is expressed by an equivalent circuit in FIG. 11a. As shown in FIG. 11a, the processor protection circuit 107 comprises a pair of normally-off transistors 120, 121 by which the interconnections 108, 109 are connected to a power supply terminal 122 and a ground terminal 123. The transistors 120, 121 serve to discharge an excessive voltage to the power supply terminal 122 and the ground terminal 123 by way of punchthrough.

Figure 11B:
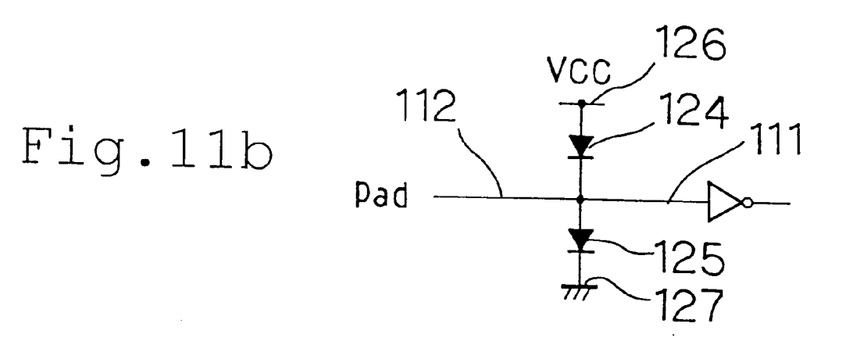
FIG. 11*b* is a circuit diagram of an equivalent circuit of a memory protection circuit.

Each of the memory protection circuits 110 is expressed by an equivalent circuit in FIG. 11b. As shown in FIG. 11b, the memory protection circuit 110 comprises a pair of parasitic diodes 124, 125 with an excessive offset by which the interconnections 111, 112 are connected to a power supply terminal 126 and a ground terminal 127. The parasitic diodes 124, 125 serve to discharge an excessive voltage to the power supply terminal 126 and the ground terminal 127.

Figure 12A:
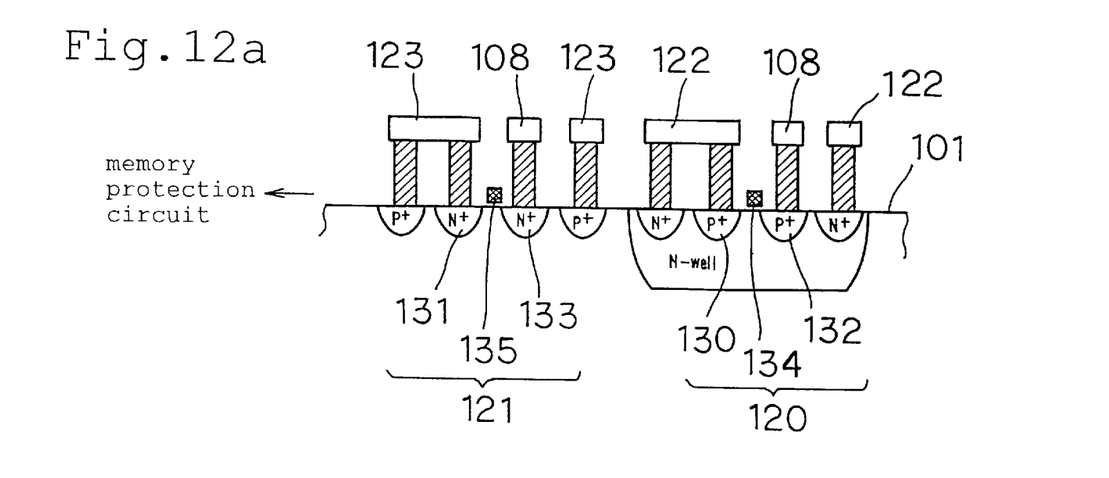
FIG. 12*a* is a schematic fragmentary vertical cross-sectional view of an internal structure of the processor protection circuit.
Figure 12B:
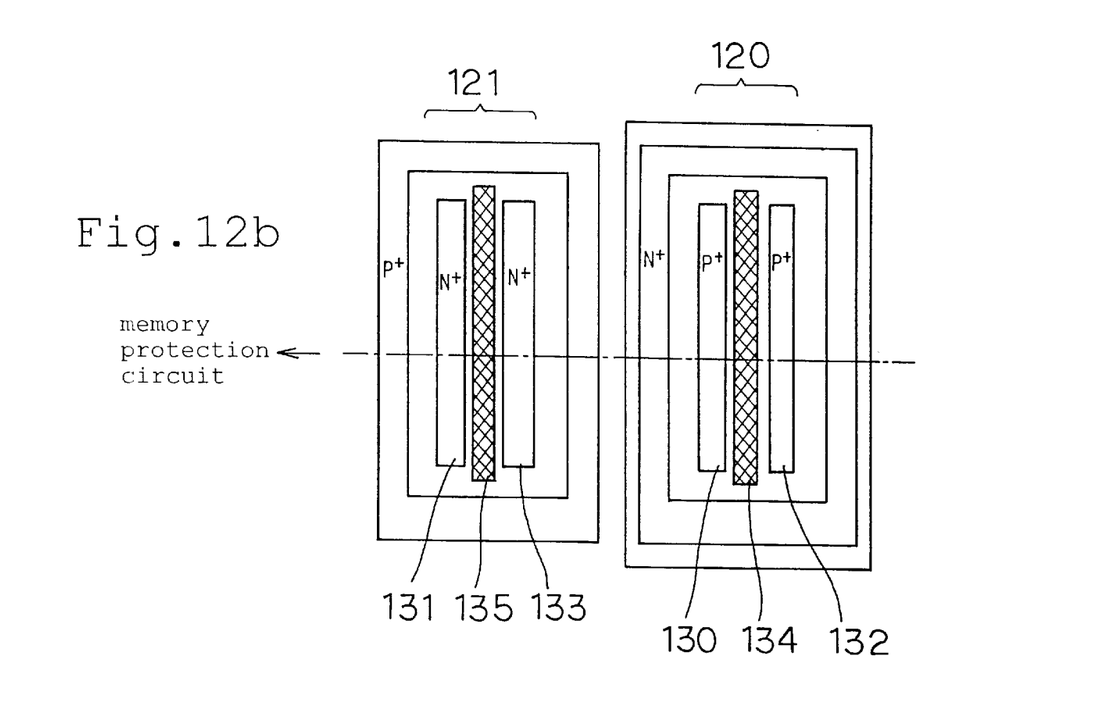
FIG. 12*b* is a plan view of an internal structure of a circuit board of the processor protection circuit.

As shown in FIGS. 12a and 12b, the transistors 120, 121 of each of the processor protection circuits 107 have respective source regions 130, 131, respective drain regions 132, 133, and respective gate electrodes 134, 135. These regions and electrodes actually comprise diffused layers in the circuit board 101 and deposited films on the circuit board 101, and are positioned adjacent to the memory protection circuit 110.

Figure 13A:
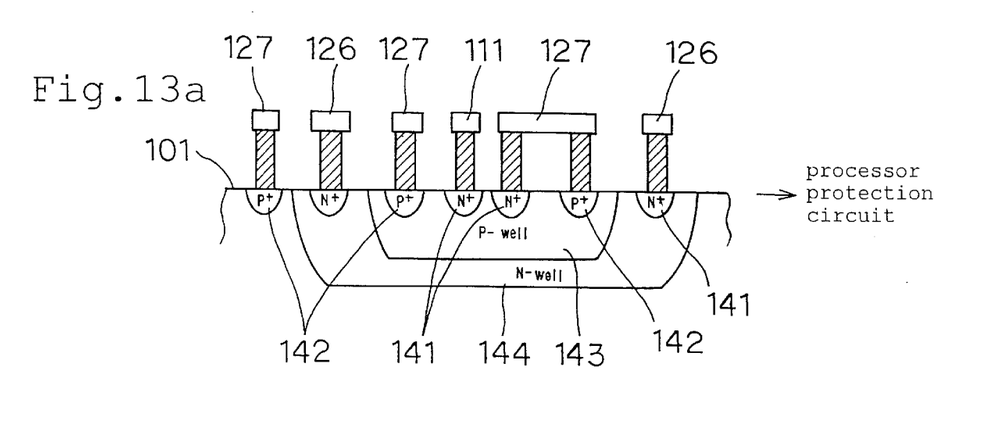
FIG. 13a is a schematic fragmentary vertical cross-sectional view of an internal structure of the memory protection circuit.
Figure 13B:
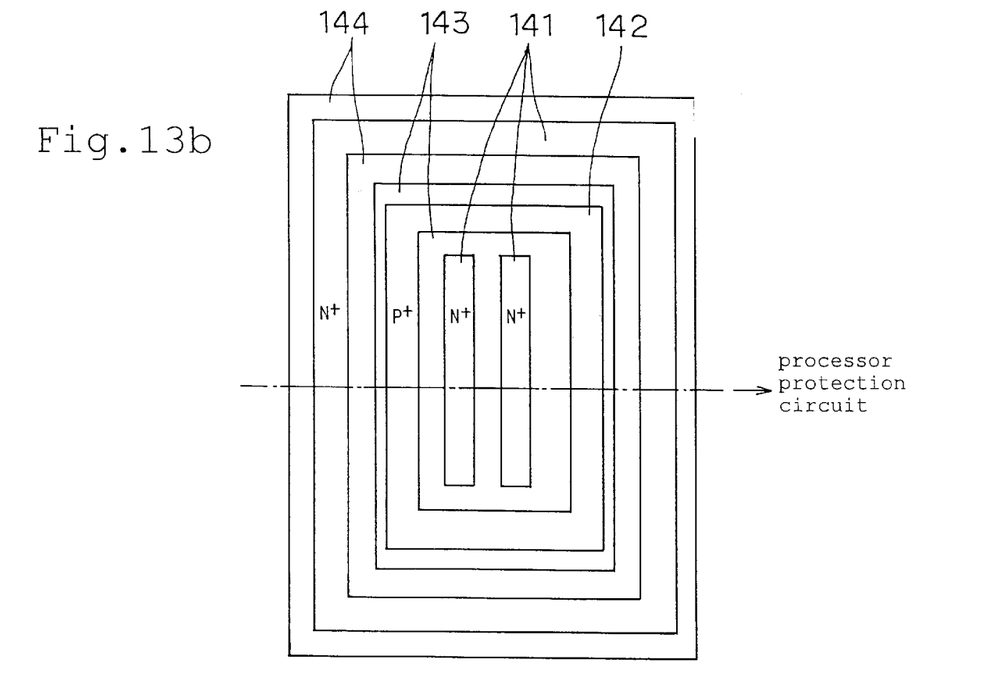
FIG. 13b is a plan view of an internal structure of a circuit board of the memory protection circuit.

As shown in FIGS. 13a and 13b, regions of each of the memory protection circuits 110 which function as the parasitic diodes 124, 125 actually comprise various diffused layers 141, 142, 143, 144 in the circuit board 101 which is of the p type, and are positioned adjacent to the processor protection circuit 107.

In the integrated-circuit device 100 according to the present invention, the microprocessor 102 is capable of processing data in various ways. In the data processing process, the microprocessor 102 reads various data from an external memory (not shown) for data processing. At this time, the microprocessor 102 can temporarily store data that are to be repeatedly processed into the cache memories 103, 104 and also temporarily store tag data into the tag memory 105.

The microprocessor 102 is capable of reading the cache data temporarily stored in the cache memories 103, 104 based on the tag data temporarily stored in the tag memory 105. Consequently, the microprocessor 102 repeatedly reads the same data less frequently from the external memory, and hence can process the data highly efficiently.

The microprocessor 102 and the external connection terminals 106 are connected via the processor protection circuits 107, and the cache memories 103, 104 are connected to the external connection terminals 106 via the memory protection circuits 110. Therefore, even when an abnormally high voltage due to an external electrostatic charge buildup is applied to the external connection terminals 106, the microprocessor 102 and the cache memories 103, 104 are prevented from being destroyed by the processor protection circuits 107 and the memory protection circuits 110.

Furthermore, the microprocessor 102, the cache memories 103, 104, and the tag memory 105 are constructed as rectangular circuit cells which are equivalent to standard cells. These rectangular circuit cells are arranged on the rectangular circuit board 101 without any substantial dead space created thereon.

In order to arrange the rectangular circuit cells without creating any substantial dead space on the rectangular circuit board 101, the tag memory 105 is specially shaped in the integrated-circuit device 100 according to the present invention.

Specifically, the microprocessor 102 which comprises a circuit cell having substantially the same structure as the existing microprocessor 2 has a length of 14.11 (mm) in the horizontal directions or x directions which is approximately equal to the length a, and a length of 13.05 (mm) in the vertical directions or y directions which is approximately equal to the length b, as shown in FIG. 5a.

The first and second cache memories 103, 104 which have a shape corresponding to the row addresses and the column addresses have a length of 15.80 (mm) in the horizontal directions which is approximately equal to the length (a+b) corresponding to the column addresses, and a length of 5.50 (mm) in the vertical directions which is approximately equal to the length d corresponding to the row addresses, as shown in FIG. 5b and FIG. 7a.

Because the first and second cache memories 103, 104 thus shaped are disposed above and below the microprocessor 102, the circuit board 101 is of a vertically elongate rectangular shape whose length in the horizontal directions or x directions is 16.48 (mm) that is approximately equal to the length (a+b) and whose length in the vertical directions or y directions is 24.90 (mm) that is approximately equal to the length (c+2d). Accordingly, a space having a size of 1.5×13 (mm), which is the same as a size of "b×c", is necessarily created laterally of the microprocessor 102.

If the tag memory 105 were simply constructed as a rectangular circuit cell having a shape corresponding to the row addresses of the cache memories 103, 104, then, as shown in FIG. 8a, the tag memory 105 would have a rectangular shape having a size of 4.2×5.5 (mm) whose length in the vertical directions is the same as the cache memories 103, 104 and whose length in the horizontal directions corresponds to one column address.

Inasmuch the tag memory 105 thus shaped could not be placed in the space having the size of 1.5×13 (mm), according to the present invention, some of the row addresses are converted to column addresses to reduce the length of the tag memory 105 in the vertical directions and increase the length thereof in the horizontal directions, as shown in FIG. 8b, and then the tag memory 105 is divided into a plurality of parts in the horizontal directions, and those parts are arrayed in the vertical directions, as shown in FIG. 8c.

In the integrated-circuit device 100, the tag memory 105 is of an elongate rectangular shape having a smaller length of 1.4 (mm) in the horizontal directions and a greater length of 12.8 (mm) in the vertical directions. Since the tag memory 105 of the elongate rectangular shape is snugly fitted in the space having the size of 1.5×13 (mm) laterally of the microprocessor 102, the overall integrated-circuit device 100 is of a rectangular shape with no substantially dead space created therein.

Moreover, each of the first cache memory 103, the second cache memory 104, and the tag memory 105 comprises a DRAM. Therefore, these memories 103, 104, 105 take up a reduced area on the circuit board 101, and hence the integrated-circuit device 100 is relatively small in overall size.

The memories 103, 104, 105, each in the form of a DRAM, are vulnerable to noise, and hence the microprocessor 102 for processing data at high speed tends to produce noise. However, since the processor protection circuits 107 and the memory protection circuits 110 are interposed between the microprocessor 102 and the memories 103–105, the microprocessor 102 and the memories 103–105 are spaced from each other without any substantial dead space created on the circuit board 101, resulting in a reduced level of mutual noise interference.

As described above, the processor protection circuits 107 and the memory protection circuits 110 are positioned adjacent to each other. Thus, their ground terminals 123, 127 are separate from each other for preventing mutual noise interference. However, because the circuit board 101 of p-type silicon is also grounded, the ground terminals 123, 127 cannot be electrically separate from each other though they are physically separate from each other.

Figure 14:
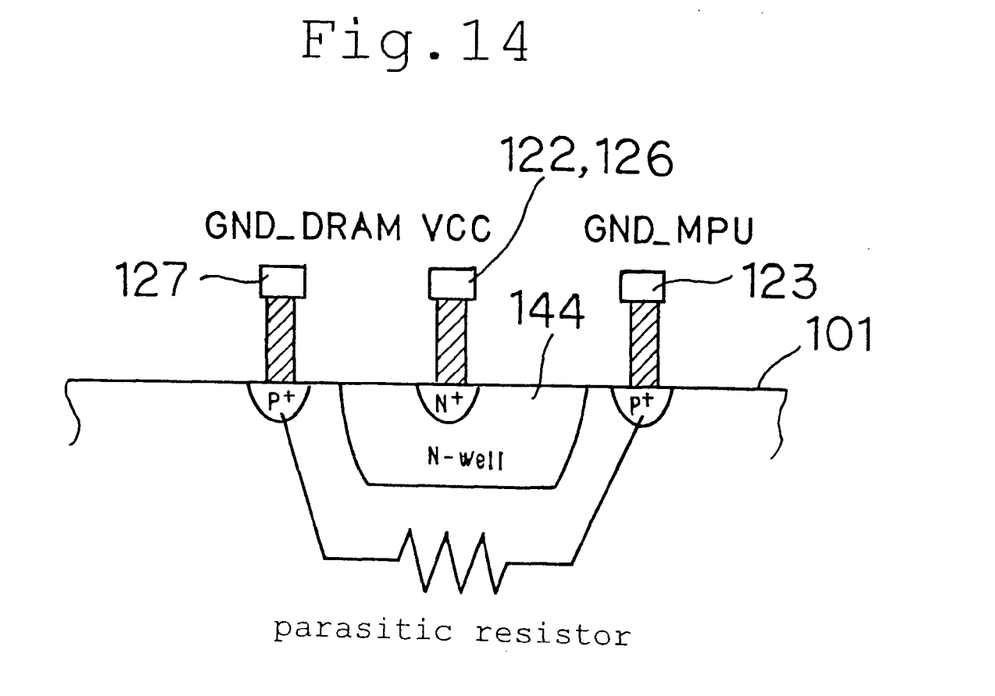
FIG. 14 is a circuit diagram of an equivalent circuit of the processor protection circuit and the memory protection circuit.

In the integrated-circuit device 100 according to the present invention, as shown in FIGS. 13a and 13b, the circuit board 101 has a diffused layer 144 in the form of a deep n well at each of the memory protection circuits 110. Because of the diffused layer 144, as shown in FIG. 14, a parasitic resistor is interposed between the ground terminals 123, 127 of the processor protection circuits 107 and the memory protection circuits 110 for thereby reducing mutual noise interference.

In the illustrated embodiment, various specific numerical values are given from an actual product that the inventor has developed. However, those specific numerical values should not be interpreted as limiting any dimensions and ratios of the integrated-circuit device according to the present invention.

While preferred embodiments of the present invention have been described using specific terms, such description is for illustrative purposes only, and it is to be understood that changes and variations may be made without departing from the spirit or scope of the following claims.

What is claimed is:

1. An integrated-circuit device comprising:
   a rectangular circuit board having side edges parallel to x and y directions perpendicular to each other;
   a first cache memory comprising a circuit cell having side edges parallel to the x and y directions and having a length in the x direction corresponding to column addresses and a length in the y direction corresponding to row addresses, said first cache memory being disposed on an end portion of said circuit board in the y direction;
   a second cache memory comprising a circuit cell having side edges parallel to the x and y directions and having a length in the x direction corresponding to column addresses and a length in the y direction corresponding to row addresses, said first cache memory being disposed on an opposite end portion of said circuit board in the y direction remote from said first cache memory on said circuit board;
   a microprocessor comprising a circuit cell having side edges parallel to the x and y directions and disposed on an end portion of said circuit board in the x direction, said microprocessor being positioned in an area between said first cache memory and said second cache memory; and
   a tag memory comprising a circuit cell having side edges parallel to the x and y directions and having a length in the x direction corresponding to column addresses and a length in the y direction corresponding to row addresses, said tag memory being disposed on an opposite end portion of said circuit board in the x direction remote from said microprocessor, said tag memory being positioned in the area between said first cache memory and said second cache memory, said tag memory having row addresses converted to column addresses;
   said lengths in the x direction of said circuit board, said first cache memory, and said second cache memory being essentially equal to each other;
   said length in the x direction of said circuit board being essentially equal to the sum of the lengths in the x direction of said microprocessor and said tag memory;
   said lengths in the y direction of said microprocessor and said tag memory essentially equal to each other;
   said length in the y direction of said microprocessor being essentially equal to the sum of the lengths in the y direction of said microprocessor, said first cache memory, and said second cache memory.

2. An integrated-circuit device according to claim 1, wherein said tag memory is of a structure in which a basic structure corresponding to the same row addresses as said first cache memory and said second cache memory and one column address is divided into a plurality of parts in one of the x and y directions, and the parts are arrayed in the other of the x and y directions.

3. An integrated-circuit device according to claim 1, wherein each of said first cache memory, said second cache memory, and said tag memory comprises a DRAM.

4. An integrated-circuit device comprising:
   a rectangular circuit board having side edges parallel to x and y directions perpendicular to each other;
   a first cache memory comprising a circuit cell having side edges parallel to the x and y directions and having a length in the x direction corresponding to column addresses and a length in the y direction corresponding to row addresses, said first cache memory being disposed on an end portion of said circuit board in the y direction;
   a second cache memory comprising a circuit cell having side edges parallel to the x and y directions and having a length in the x direction corresponding to column addresses and a length in the y direction corresponding to row addresses, said first cache memory being disposed on an opposite end portion of said circuit board in the y direction remote from said first cache memory on said circuit board;
   a microprocessor comprising a circuit cell having side edges parallel to the x and y directions and disposed on an end portion of said circuit board in the x direction, said microprocessor being positioned in an area between said first cache memory and said second cache memory; and
   a tag memory comprising a circuit cell having side edges parallel to the x and y directions and having a length in the x direction corresponding to column addresses and a length in the y direction corresponding to row addresses, said tag memory being disposed on an opposite end portion of said circuit board in the x direction remote from said microprocessor, said tag memory being positioned in the area between said first cache memory and said second cache memory, said tag memory having column addresses converted to row addresses;
   said lengths in the x direction of said circuit board, said first cache memory, and said second cache memory being essentially equal to each other;
   said length in the x direction of said circuit board being essentially equal to the sum of the lengths in the x direction of said microprocessor and said tag memory;
   said lengths in the y direction of said microprocessor and said tag memory essentially equal to each other;
   said length in the y direction of said microprocessor being essentially equal to the sum of the lengths in the y direction of said microprocessor, said first cache memory, and said second cache memory.

5. An integrated-circuit device according to claim 4, wherein said tag memory is of a structure in which a basic structure corresponding to the same row addresses as said first cache memory and said second cache memory and one column address is divided into a plurality of parts in one of the x and y directions, and the parts are arrayed in the other of the x and y directions.

6. An integrated-circuit device according to claim 4, wherein each of said first cache memory, said second cache memory, and said tag memory comprises a DRAM.

* * * * *